(12) United States Patent
Yamasaki et al.

(10) Patent No.: US 9,001,202 B2
(45) Date of Patent: *Apr. 7, 2015

(54) COMPONENT MOUNTING APPARATUS AND COMPONENT DETECTION METHOD

(75) Inventors: Noboru Yamasaki, Yamanashi (JP); Yasuichi Okada, Yamanashi (JP); Shozo Fukuda, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 332 days.

This patent is subject to a terminal disclaimer.

(21) Appl. No.: 13/582,850

(22) PCT Filed: Aug. 3, 2011

(86) PCT No.: PCT/JP2011/004408
§ 371 (c)(1),
(2), (4) Date: Sep. 5, 2012

(87) PCT Pub. No.: WO2012/023251
PCT Pub. Date: Feb. 23, 2012

(65) Prior Publication Data
US 2013/0010101 A1 Jan. 10, 2013

(30) Foreign Application Priority Data
Aug. 17, 2010 (JP) .................. 2010-182044

(51) Int. Cl.
*H04N 5/253* (2006.01)
*H05K 13/04* (2006.01)

(52) U.S. Cl.
CPC .................. *H05K 13/0413* (2013.01)

(58) Field of Classification Search
USPC ......... 348/87, 94; 29/709; 702/185; 700/121; 356/237.4; 382/147, 149
See application file for complete search history.

(56) References Cited

U.S. PATENT DOCUMENTS 5,339,248 A * 8/1994 Fujiwara et al. .............. 700/121
5,619,328 A * 4/1997 Sakurai .......................... 356/621
(Continued)

FOREIGN PATENT DOCUMENTS

JP 2007-200990 A 8/2007
JP 2009-54819 A 3/2009
(Continued)

OTHER PUBLICATIONS

International Search Report for PCT/JP2011/004408 dated Sep. 27, 2011.

*Primary Examiner* — Brian Yenke
(74) *Attorney, Agent, or Firm* — Pearne & Gordon LLP

(57) ABSTRACT

A transfer pathway of a mounting head 10 in a component-mounting round during which the mounting head 10 moves back and forth between a component feeding unit 4 and a substrate conveyance mechanism 2 is derived by a transfer pathway calculation unit 25 for each component-mounting round from mounting program data 21*a*. A focusing processing unit 24 controls an optical system focusing mechanism 18, thereby matching a focusing point of a line sensor camera 14 achieved during imaging operation to the transfer pathway of the mounting head 10 based on data pertaining to the derived transfer pathway. Further, an optical system zooming mechanism 17 adjusts an imaging range according to the focusing point. Accordingly, even when a long substrate 3 is taken as an object, it is possible to detect with high precision whether or not a component exists on the pickup nozzle 11 of the mounting head 10.

4 Claims, 5 Drawing Sheets

(56) References Cited

U.S. PATENT DOCUMENTS

| | | | |
|---|---|---|---|
| 6,538,750 B1* | 3/2003 | Fishbaine et al. | 356/614 |
| 7,033,842 B2* | 4/2006 | Haji et al. | 438/6 |
| 7,546,678 B2* | 6/2009 | Asai et al. | 29/743 |
| 7,571,539 B2* | 8/2009 | Maenishi et al. | 29/834 |
| 7,818,086 B2* | 10/2010 | Awata et al. | 700/121 |
| 7,890,204 B2* | 2/2011 | Maenishi | 700/121 |
| 7,995,834 B1* | 8/2011 | Knighton et al. | 382/154 |
| 8,553,080 B2* | 10/2013 | Endo et al. | 348/87 |
| 2003/0177633 A1* | 9/2003 | Haji et al. | 29/743 |
| 2005/0076498 A1* | 4/2005 | Mizuno et al. | 29/740 |
| 2005/0115063 A1* | 6/2005 | Saito et al. | 29/743 |
| 2007/0074390 A1* | 4/2007 | Ota et al. | 29/833 |
| 2010/0254788 A1* | 10/2010 | Dromard et al. | 414/222.02 |
| 2010/0321487 A1 | 12/2010 | Endo et al. | |
| 2012/0060357 A1* | 3/2012 | Kaida et al. | 29/593 |
| 2012/0062727 A1* | 3/2012 | Kaida et al. | 348/87 |
| 2012/0293648 A1* | 11/2012 | Nakayama et al. | 348/87 |

FOREIGN PATENT DOCUMENTS

| | | |
|---|---|---|
| JP | 2009-54820 A | 3/2009 |
| JP | 2009-54821 A | 3/2009 |

* cited by examiner

COMPONENT MOUNTING APPARATUS AND COMPONENT DETECTION METHOD

TECHNICAL FIELD

The present invention relates to a component mounting apparatus that picks up and holds components by use of a mounting head, to thus transfer and mount the components on a substrate, and a component detection method for detecting whether or not a component still exists on any of lower ends of pickup nozzles provided on mounting heads of the component mounting apparatus.

BACKGROUND ART

A component mounting apparatus that mounts components, like semiconductor devices, on a substrate, repeatedly performs component mounting operation. Specifically, a mounting head picks up, by means of vacuum suction, a component from a component feeding unit where a plurality of parts feeders, like tape feeders, are disposed side by side. The mounting head then transfers and mounts the component on a substrate positioned and held by a substrate holding unit. Faulty operation; that is, unreliable holding and releasing of a component due to instability of vacuum pickup, is likely to occur during the component mounting operation. For instance, in mounting operation for mounting components on a substrate, a component is released from a pickup nozzle by means of halting vacuum suction. At this time, there may be a case where a component will still remain adhered to and unreleased from a pickup surface of the pickup nozzle for any reasons. In such a case, a so-called "brought-back component" occurs. More specifically, during the component mounting operation, a component has not been mounted on a substrate and returns to the component feeding unit along with the mounting head while remaining unmounted. For this reason, next component mounting operation cannot be performed normally, which causes an operation error.

In order to detect such a brought-back component, a hitherto-employed component mounting apparatus has a component detecting function for detecting whether or not a component still exists on any of lower ends of the pickup nozzles of the mounting heads (see; for instance, Patent Document 1). The related art described in connection with the example patent document is directed toward a configuration in which a component detector made up of a light projector and a line sensor camera is disposed while a transfer pathway along which a corresponding mounting head moves back and forth between a substrate retaining unit and a component feeding unit is taken as an inspection object. When a pickup nozzle of the mounting head crosses a belt-shaped inspection beam projected from the light projector toward the line sensor camera, the line sensor camera captures an image. By means of the image, detection is made as to whether or not a component still exists on any of the pickup nozzles.

RELATED ART DOCUMENT

Patent Document

Patent Document 1: JP-A-2009-54819

DISCLOSURE OF THE INVENTIONS

Problem that the Invention is to Solve

However, when the substrate that is to be an object of mounting operation is a long substrate that is longer than a substrate of related-art type, the foregoing related art encounters the following problems. Specifically, in a component mounting apparatus that handles a long substrate as a work object, a length of a walking beam of a head transfer mechanism that horizontally transfers the mounting heads is required to be commensurate with the length of the substrate. Hence, detection spacing between the light projector and the line sensor camera in the component detecting apparatus becomes considerably larger than that required when a substrate of normal size is a work object. As a consequence, an imaging focal point range achieved when the line sensor camera captures an image to detect whether or not a component still exists on any of the pickup nozzles becomes inevitably larger. Incidentally, an optical system provided in the line sensor camera hitherto has a fixed focus and hence cannot cover a long imaging focal point range, such as that achieved when a long substrate is taken as an object. For this reason, an image captured at the position where the mounting head passes exhibits a low focusing level, which causes a case where difficulty is encountered in detecting presence or absence of a component with high precision.

Accordingly, the present invention is intended to provide a component mounting apparatus and a component detection method that make it possible to detect presence or absence of a component on a pickup nozzle of a mounting head with high precision even when a long substrate is taken as an object.

Means for Solving the Problem

A component mounting apparatus of the present invention corresponds to A component mounting apparatus that picks up a component from a component feeding unit by a mounting head, transferring and mounting the component on a substrate, the apparatus comprising:

a substrate conveyance mechanism that conveys the substrate in a first direction, positioning and retaining the substrate at a component mounting operation position and a head transfer mechanism that transfers the mounting head in the first direction and a second direction orthogonal to the first direction by a first transfer mechanism and a second transfer mechanism, thereby moving the mounting head between the substrate conveyance mechanism and the component feeding unit disposed beside the substrate conveyance mechanism in the second direction thereof;

an imaging unit that includes a light projection unit projecting a belt-like inspection beam and a line sensor camera which receives the inspection beam and which outputs the beam as image data representing a state of a lower end of a pickup nozzle attached to the mounting head and that are configured such that the light projection unit and the line sensor camera are placed opposite to each other with a transfer pathway of the mounting head interposed therebetween and outside a transfer stroke of the mounting head in the first direction thereof;

a focusing processing unit that controls an optical system whose focusing point is variably set on the line sensor camera, thereby adjusting the focusing point of the line sensor camera to a desired position during imaging operation;

a transfer pathway calculation unit that derives, in each of component-mounting rounds, from mounting program data targeted for the substrate the transfer pathway of the mounting head in a component-mounting round during which the mounting head is moved back and forth between the component feeding unit and the substrate conveyance mechanism;

an imaging control unit that controls the focusing processing unit on the basis of data pertaining to the derived transfer pathway, thereby matching the focusing point of the line sensor camera to the transfer pathway of the mounting head in each of component-mounting round; and a determination processing unit that determines from the image data whether or not a component exists on the lower end of the pickup nozzle.

A component detection method of the present invention corresponds to a component detection method for detecting whether or not a component exist on a lower end of a pickup nozzle of a mounting head in a component mounting apparatus that picks up a component from component feeding unit by the mounting head, transferring and mounting the component on a substrate, wherein the apparatus comprises a substrate conveyance mechanism that conveys the substrate in a first direction, positioning and retaining the substrate at a component mounting operation position and a head transfer mechanism that transfers the mounting heads in the first direction and a second direction orthogonal to the first direction by a first transfer mechanism and a second transfer mechanism, thereby moving the mounting head between the substrate conveyance mechanism and the component feeding unit disposed beside the substrate conveyance mechanism in the second direction thereof, an imaging unit that includes a light projection unit for projecting a belt-like inspection beam and a line sensor camera which receives the inspection beam and which outputs the beam as image data representing a state of the lower ends of the pickup nozzle attached to the mounting head and that are configured such that the light projection unit and the line sensor camera are placed opposite to each other with a transfer pathway of the mounting head interposed therebetween and outside a transfer stroke of the mounting head in the first direction thereof, and a focusing processing unit that controls an optical system whose focusing point is variably set on the line sensor camera, thereby adjusting the focusing point of the line sensor camera to a desired position during imaging operation; and wherein the method includes a transfer pathway calculation step of deriving, in each of component-mounting rounds, from mounting program data targeted for the substrate the transfer pathways of the mounting head in a component-mounting round during which the mounting head are moved back and forth between the component feeding unit and the substrate conveyance mechanism, an imaging control step of controlling the focusing processing unit on the basis of data pertaining to the derived transfer pathways, thereby matching the focusing point of the line sensor camera to the transfer pathway of the mounting head in each of the component-mounting rounds, and a determination processing step of determining from the image data output from the line sensor camera whether or not a component still exists on any of the lower ends of the pickup nozzle.

Advantage of the Invention

According to the present invention, a transfer pathway of each of mounting heads in a component-mounting round during which the mounting head moves back and forth between a corresponding component feeding unit and a substrate conveyance mechanism is derived for each component-mounting round from mounting program data. A focusing point of a line sensor camera achieved during imaging operation is matched to a desired point, whereby the focusing point of the line sensor camera can be matched to the transfer pathway of each of the mounting heads in each of component-mounting rounds. Accordingly, even when a long substrate is taken as an object, it is possible to detect with high precision whether or not a component still exists on a pickup nozzle of the mounting head.

EMBODIMENT FOR IMPLEMENTING THE INVENTION

Figure 1:
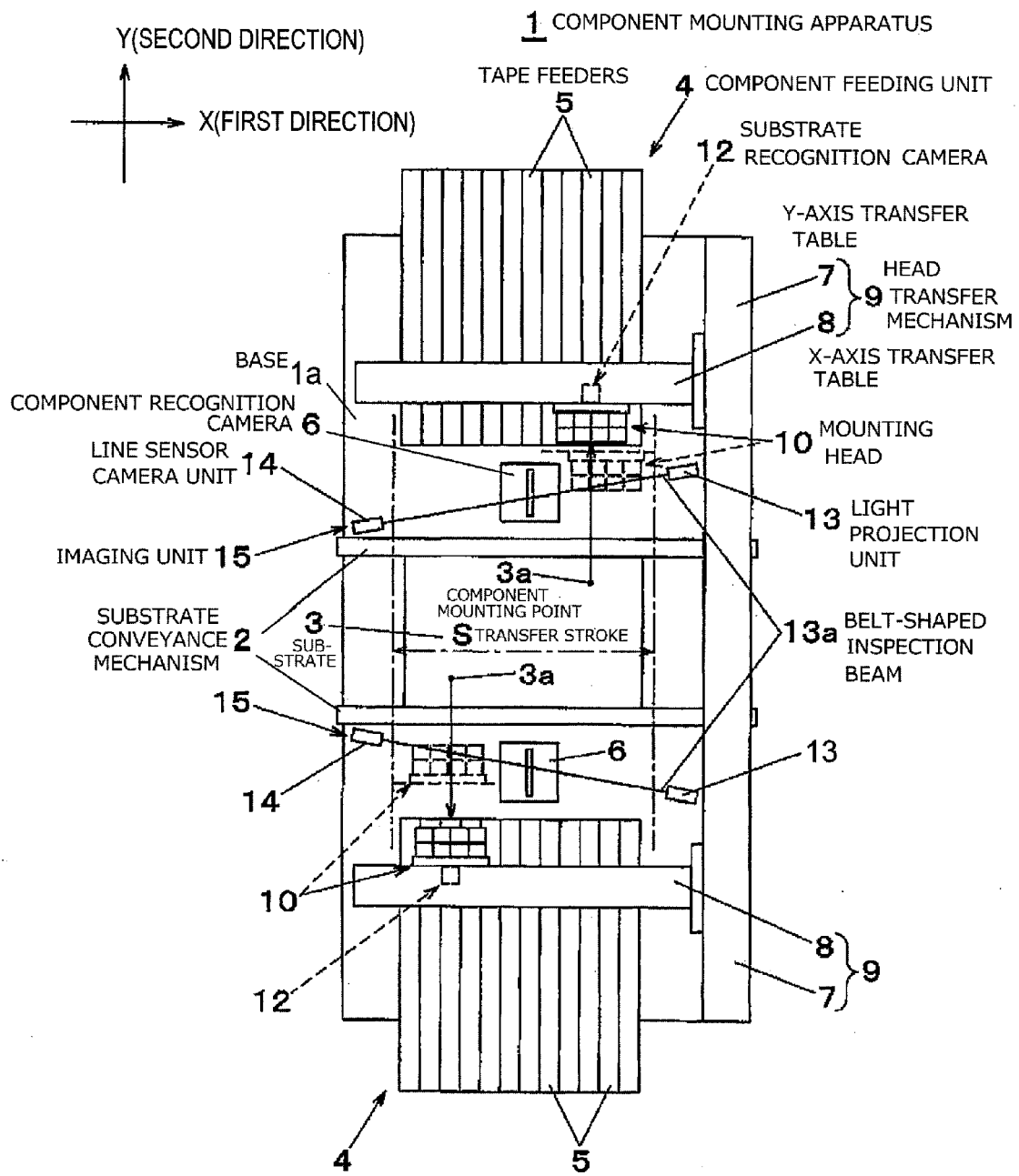
FIG. 1 is a plan view of a component mounting apparatus of an embodiment of the present invention.

An embodiment of the present invention is now described by reference to the drawings. First, a configuration of a component mounting apparatus 1 is now described by reference to FIG. 1. The component mounting apparatus 1 has a function of taking a component out of a component feeding unit by means of a mounting head and transferring and mounting the component on a substrate. In FIG. 1, a substrate conveyance mechanism 2 is disposed along a direction X (a first direction) on an upper surface of a base 1a. The substrate conveyance mechanism 2 conveys a substrate 3 that is to be an object of component mounting operation along the direction X that is a direction of conveyance of a substrate and also positions and retains the substrate at a mounting operation position for a component mounting mechanism which will be described below. In the embodiment, a long substrate that is longer than a substrate of normal type in the direction of conveyance is taken as an objective; namely, the substrate 3.

A component feeding unit 4 is disposed on either side of the substrate conveyance mechanism 2 in a direction Y (a second direction) of the substrate conveyance mechanism 2. In each of the component feeding units 4, a plurality of tape feeders 5 are put side by side. Each of the tape feeders 5 performs pitch-feeding of a carrier tape holding components to be mounted, thereby supplying a component to a pickup position for a mounting head 10. An Y-axis transfer table 7 is disposed at one end of the base 1a in its direction X while being oriented in the direction Y. Two X-axis transfer tables 8 are joined to the Y-axis transfer table 7 so as to be transferable in the direction Y. The mounting head 10 is fitted to each of the X-axis transfer tables 8 so as to be transferable in the direction X. The Y-axis transfer table 7 and the X-axis transfer tables 8 are actuated, whereupon the mounting heads 10 are horizontally transferred in both the directions X and Y.

Figure 2:
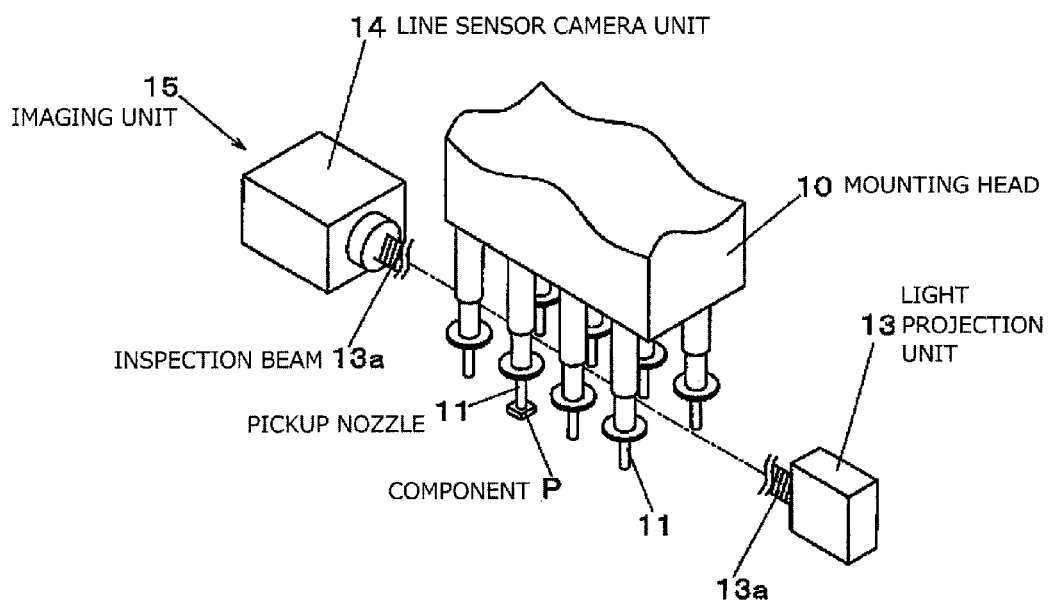
FIG. 2 is an explanatory view of a mounting head belonging to and component detection performed by the component mounting apparatus of the embodiment of the present embodiment.

Specifically, the X-axis transfer tables 8 act as a first transfer mechanism that transfers the mounting heads 10 in the first direction. The Y-axis transfer table 7 acts as a second transfer mechanism that transfers the mounting heads 10 in the second direction. Each pair consisting of the X-axis transfer table 8 and the Y-axis transfer table 7 makes up a head transfer mechanism 9 that transfers a corresponding mounting head 10 between the substrate conveyance mechanism 2 and the component feeding unit 4 disposed beside the substrate conveyance mechanism 2 in its direction Y. As shown in FIG. 2, each of the mounting heads 10 is a multi-type component retaining head having a plurality of pickup nozzles 11 that can individually ascend or descend. Each of the pickup nozzles 11 picks up and retains a component P that is an object of mounting.

An imaging unit 15 made up of a component recognition camera 6, a light projection unit 13, and a line sensor camera 14 is interposed between the substrate conveyance mechanism 2 and each of the component feeding units 4. A substrate recognition camera 12 that is transferred in conjunction with the mounting head 10 is put on each of the X-axis transfer tables 8 while an imaging plane of the camera is downwardly oriented. The mounting head 10 picked up components from the component feeding unit 4 performs scanning operation while moving in the direction X above the corresponding component recognition camera 6, whereby the component recognition camera 6 captures an image of the component P (see FIG. 2) picked up and retained by the pickup nozzles 11 of the mounting head 10. An image recognition processing unit 23 (see FIG. 5) subjects an image captured by imaging action to recognition processing, whereby absence/presence or positional displacement of the component P retained by the mounting head 10 can be detected. The substrate recognition camera 12 captures an image of the substrate 3 at timing when the mounting head 10 has transferred to a position above the substrate 3, whereby a position on the substrate 3 where the component is mounted is detected.

In the imaging unit 15, the light projection unit 13 and the line sensor camera 14 are positioned opposite to each other such that a transfer pathway for a component-mounting round during which the mounting head 10 moves back and forth between the substrate 3 and the component feeding unit 4 is interposed therebetween. Both the light projection unit 13 and the line sensor camera 14 are disposed outside a range of a transfer stroke S of each of the mounting heads 10 in the direction X, thereby preventing the imaging unit 15 from uniting transfer of the mounting heads 10. Each of the light projection units 13 has a function of projecting a highly directional beam, such as a laser beam, in a belt like shape. Each of the line sensor camera units 14 has a function of receiving the belt-shaped inspection beam and outputting the inspection beam as image data that show a state of a lower end of each of the pickup nozzles 11 attached to the mounting head.

As shown in FIG. 2, the imaging unit 15 receives a belt-shaped inspection beam 13a projected from the light projection unit 13 by means of the line sensor camera 14. There is detected presence or absence of a component brought back by the mounting head 10 in the course of the mounting head returning to the component feeding unit 4 after component mounting operation targeted for a component mounting point 3a on the substrate 3; namely, the component P that returns to the component feeding unit 4 while remaining adhered to the lower end of the pickup nozzle 11 without being properly mounted on the substrate 3 during component mounting operation.

Figure 3:
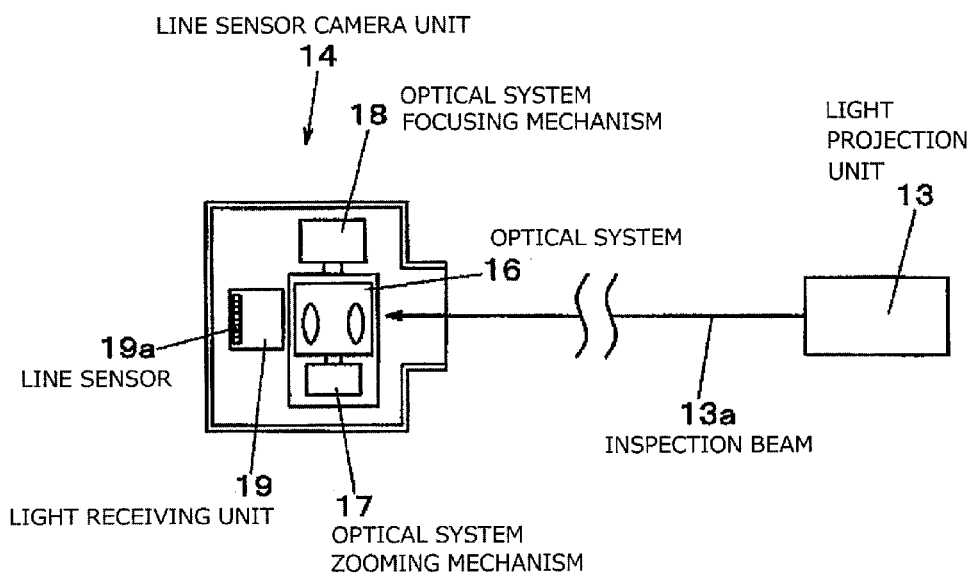
FIG. 3 is an explanatory view of a structure of an imaging unit for component detection in the component mounting apparatus of the embodiment of the present invention.

By reference to FIG. 3, a configuration of the line sensor camera 14 employed in the imaging unit 15 is now described. The line sensor camera 14 is made up of a light receiving unit 19 including a line sensor 19a formed from serially-arranged light receiving elements and an optical system 16 for forming an image on the line sensor 19a from incident light for imaging purpose. The inspection beam 13a emitted from the light projection unit 13 enters the light receiving unit 19 by way of the optical system 16. The mounting head 10 is transferred in such a way that lower ends of the pickup nozzles 11 that are imaging objects cross the inspection beam 13a, whereby a one-dimensional image of a neighborhood of the lower ends of the pickup nozzles 11 is formed on the light receiving elements of the line sensor 19a.

Figure 4A:
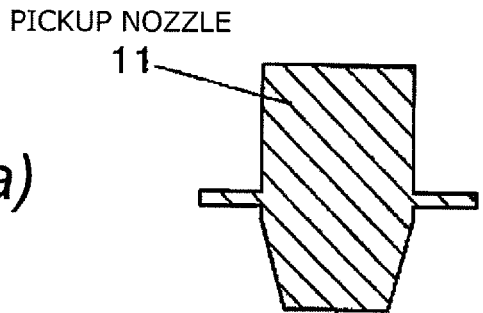
FIGS. 4 (a), (b), (c) are explanatory views of component detection performed by the component mounting apparatus of the embodiment of the present invention.
Figure 4B:
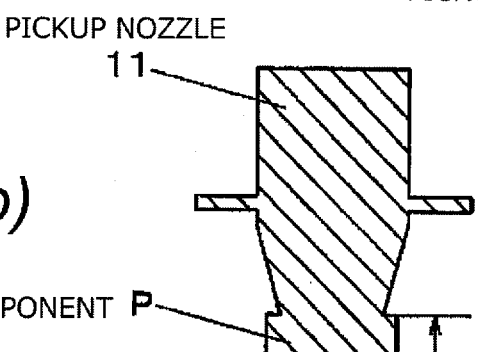
Figure 4C:
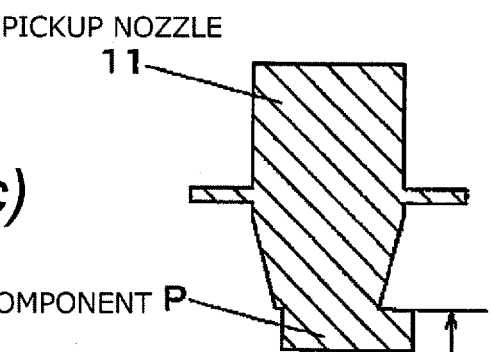

The one-dimensional image is acquired at a plurality of timings in synchronism with horizontal transfer of the mounting head 10. The recognition processing unit 23 processes the plurality of one-dimensional images, whereby an image representing a state of the lower ends of the pickup nozzles 11 of the mounting head 10, such as that shown in FIG. 4, is acquired. Specifically. FIG. 4(a) shows a normal state in which a brought-back component is not left on the pickup nozzle 11. On the contrary, FIG. 4(b) shows an example in which an image equivalent to the component P is detected to exist on any the lower ends 11a of the pickup nozzles 11 without involvement of positional displacement. FIG. 4(c) shows an example in which the component P is detected to exist, while being displaced, on any of the lower ends 11a of the pickup nozzles 11.

The optical system 16 is equipped with an optical system focusing mechanism 18. A focusing point of the optical system 16 can change as a result of actuation of the optical system focusing mechanism 18. In a component-mounting round during which each of the mounting heads 10 moves back and forth between the substrate 3 and the component feeding unit 4, the focusing point of the optical system 16 is matched to the transfer pathway of the corresponding mounting head 10 in each of the component-mounting rounds. As a result, even when the long substrate 3 is taken as an object and when a distance between the pickup nozzle 11 that is an imaging target and the line sensor camera 14 in each of the component-mounting rounds changes in each component-mounting round, a clear image exhibiting a superior focusing level can be acquired.

Moreover, the optical system 16 is configured in such a way that a plurality of lens groups are combined so as to be movable along the direction of an optical axis. The imaging range of each of the line sensor camera 14 can be adjusted to a desired size according to the focusing point adjusted by the optical system focusing mechanism 18. As a result, even when the long substrate 3 is taken as an object and when the pickup nozzle 11 situated at a position distant from the line sensor camera 14 is taken as an imaging object, the imaging range can be set to a size appropriate for detecting a component, so that accuracy of recognition can be enhanced.

Figure 5:
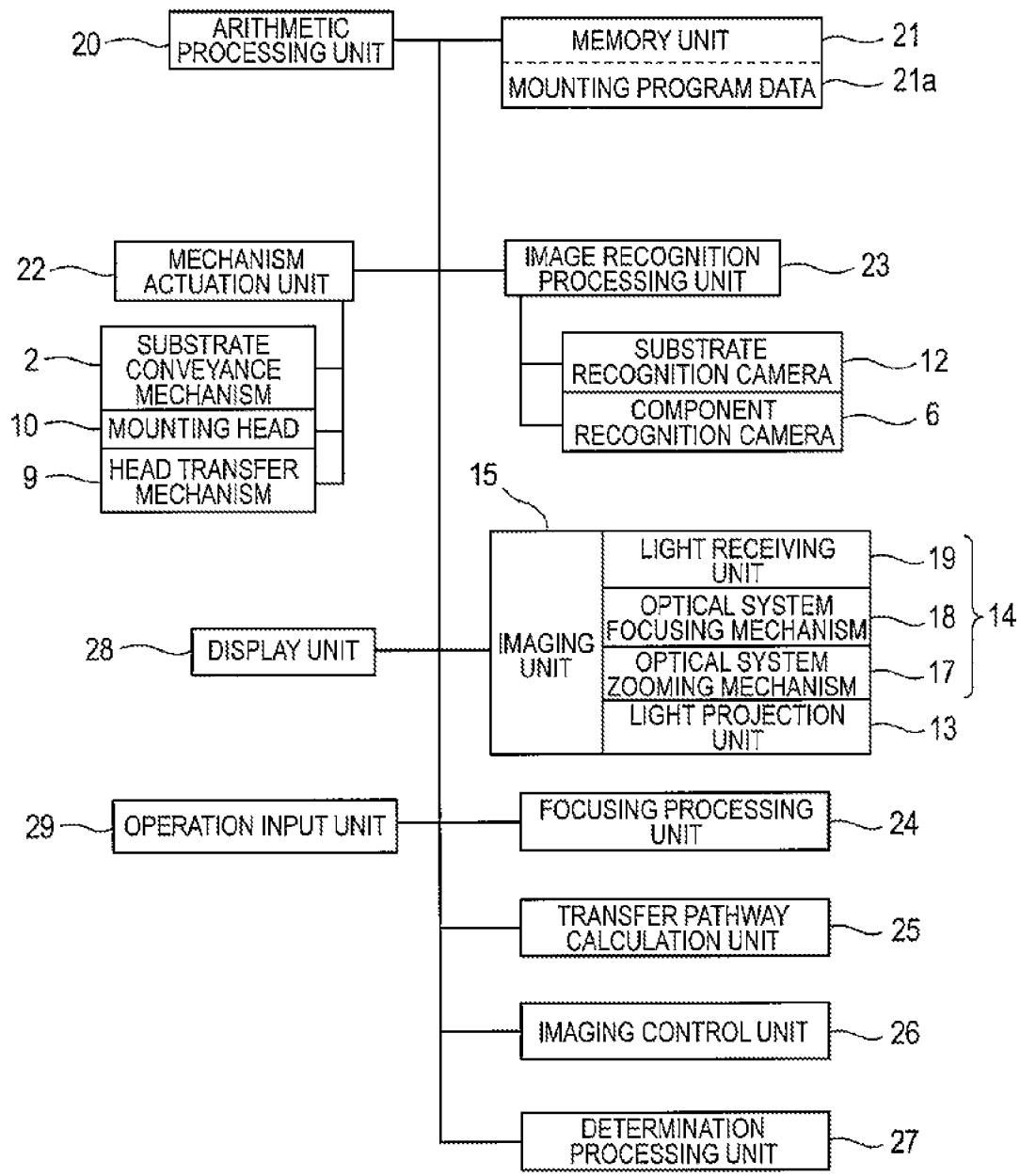
FIG. 5 is a unit diagram showing a configuration of a control system of the component mounting apparatus of the embodiment of the present invention.

By reference to FIG. 5, a configuration of a control system is now described. An arithmetic processing unit 20 is a CPU. According to a program or data stored in a memory unit 21, the arithmetic processing unit 20 controls respective units provided below, thereby letting the units perform operation or processing that is necessary for the component mounting apparatus 1 to perform component mounting operation. The memory unit 21 stores mounting program data 21a including an operation program for component mounting operation, mount data, and the like. The mounting program data 21a include mount sequence data showing a sequence of execution of mounting operation targeted for a plurality of component mounting points set on the substrate 3, mounting position data for locating positions of the respective component mounting points.

A mechanism actuation unit 22 actuates the substrate conveyance mechanism 2, the mounting heads 10, and the head transfer mechanisms 9 under control of the arithmetic processing unit 20. The image recognition processing unit 23 subjects image data acquired by the substrate recognition cameras 12 and the component recognition cameras 6 to recognition processing. Positions of the component mounting points on the substrate 3 and positional displacements of the components P retained by the respective mounting heads 10 are thereby detected. By means of component positioning operation during which the head transfer mechanisms 9 transfer the respective mounting heads 10, positional corrections are made on the basis of results of positional recognition. The image recognition processing unit 23 combines together one-dimensional images output from the light receiving unit 19 making up the imaging unit 15, thereby acquiring two-dimensional image data representing a state of lower ends of the plurality of pickup nozzles 11 of each of the mounting heads 10. The optical system focusing mechanism 18, the optical system zooming mechanism 16, and the light projection unit 13 of the imaging unit 15 are controlled by an imaging control unit 26 which will be described below.

A focusing processing unit 24 controls the optical system focusing system 18 of the optical system 16 whose focusing point is variably set by the line sensor camera 14, thereby performing processing for matching the focusing point of the line sensor camera 14 achieved during imaging operation to a desired position. A transfer pathway calculation unit 25 has a function of deriving from the mounting program data 21a targeted for the substrate 3, a transfer pathway of each of the mounting heads 10 for a component-mounting round during which the mounting head 10 moves back and forth between the component feeding unit 4 and the substrate 3 positioned and retained by the substrate conveyance mechanism 2, in each component-mounting round.

Specifically, a location of a transfer destination for a next component-mounting round employed when the mounting head 10 returns from the component mounting point 3a for one component-mounting round to the component feeding unit 4 in order to pick up a component for another component-mounting round is specified by means of mounting sequence data and mounting position data included in the mounting program data 21a. There is thereby derived a position where the transfer pathway of the mounting head 10 crosses the inspection beam 13a that originates from the light projection unit 13 to the line sensor camera 14 in the imaging unit 15.

The imaging control unit 26 controls imaging operation of the imaging unit 15 and also controls the focusing processing unit 24 on the basis of data pertaining to the transfer pathway derived by the transfer pathway calculation unit 25. The focusing point of the line sensor camera 14 can be matched to the transfer pathway of each of the mounting heads 10 in each of the component-mounting rounds. A determination processing unit 27 performs processing for determining whether or not the component P still exists on any of lower ends of the pickup nozzles 11, on the basis of image data representing a state of the lower ends of the pickup nozzles 11.

A display unit 28 is a display panel, like a liquid crystal panel. In addition to displaying images captured by the substrate recognition camera 12, the component recognition camera 6, and the imaging unit 15, the display unit 28 displays a guide screen for inputting a command, data, and the like, used for operating the component mounting apparatus 1. An operation input unit 29 is input means, like touch panel switches provided on a keyboard or in a display screen of the display unit 28. The operation input unit 29 enables entry of commands and data for operation.

Figure 6:
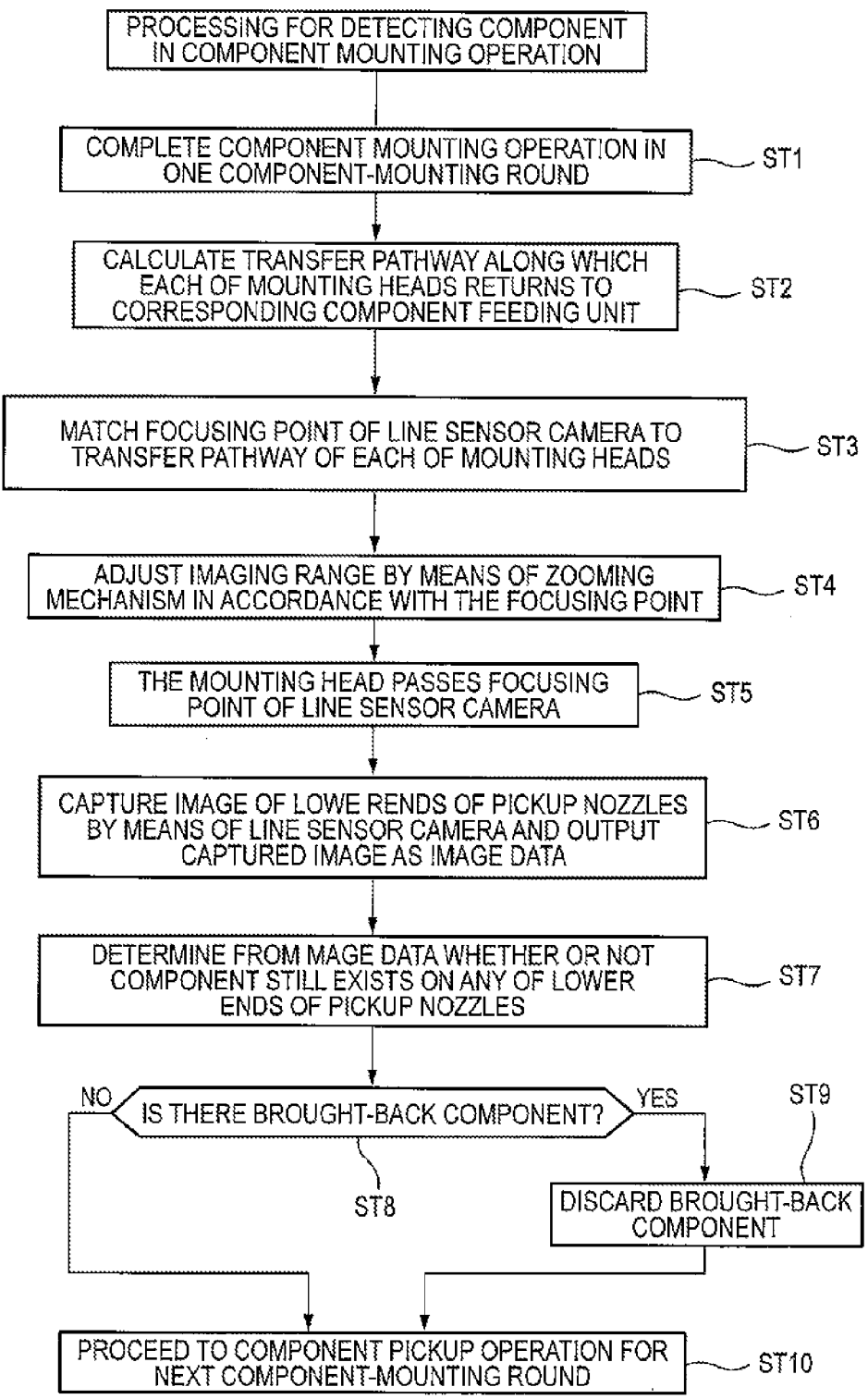
FIG. 6 is a flowchart showing component detection processing performed under a component mounting method of the embodiment of the present invention.

By reference to FIG. 6, component detection processing of the embodiment is now described. Component detection processing is for a component mounting apparatus in which the mounting head 10 picks up a component from a corresponding component feeding units 4 and transfers and mounts the component on the long substrate 3; specifically, intended for detecting whether or not the components P is still on the lower ends of the respective pickup nozzles 11 provided on the mounting head 10 in the component-mounting round during which the mounting head 10 moves back and forth between the substrate 3 and the component feeding unit 4.

In FIG. 6, component mounting operation for one component-mounting round is first completed (ST1). For instance, as shown in FIG. 1, component mounting operation targeted for the component mounting point 3a on the substrate 3 is performed. Next, the transfer pathway calculation unit 25 calculates the transfer pathway along which each of the mounting heads 10 returns to the component feeding unit 4 in order to shift to a next component-mounting round, by reference to the mounting program data 21a (ST2). Specifically, a transfer pathway of each of the mounting heads 10 in a component-mounting round during which the mounting head 10 moves back and force between the component feeding unit 4 and the substrate conveyance mechanism 2 is derived for each component-mounting round on the basis of the mounting program data 21a targeted for the substrate 3 (a transfer pathway calculation step).

The focusing point of the line sensor camera 14 is matched to the calculated transfer pathway of each of the mounting heads 10 (ST3). Specifically, the focusing processing unit 24 is controlled on the basis of data pertaining to the thus-derived transfer pathway, whereby the focusing point of the line sensor camera 14 is matched to the transfer pathway of the mounting head 10 in each of the component-mounting rounds (an imaging control step). In the imaging control step, the optical system zooming mechanism 17 adjusts an imaging range according to a focusing point (ST4).

Each of the mounting heads 10 now initiates return operation and crosses the focusing point of the line sensor camera 14 in the transfer pathway of the mounting head (ST5). The line sensor camera 14 captures an image of the lower ends of the pickup nozzles 11 at this time and outputs a plurality of pieces of one-dimensional image data to the recognition processing unit 23 (ST6). The recognition processing unit 23 acquires, from the one-dimensional image data, two-dimensional image data representing a state of the lower ends of the pickup nozzles 11. It is now determined from the two-dimensional image data whether or not the component P still exists on any of lower ends of the pickup nozzles 11 (ST7). Specifically, it is determined from the image data output from the line sensor camera 14 whether or not the component P still exists on any of the lower ends of the pickup nozzles 11 (a determination processing step).

Even when the transfer pathway of each of the mounting heads 10 changes in each of component-mounting rounds, the focusing point of the line sensor camera 14 can be matched to the transfer pathway at all times; hence, a clear image exhibiting a high focusing level can be acquired by means of imaging performed by the line sensor camera 14. Further, even when the pickup nozzles 11 in the course of moving along the transfer pathway situated remotely from the line sensor camera unit 14 are taken as imaging targets, the imaging field of view is set to an appropriate size, thereby making it possible to enhance a degree of recognition accuracy.

A determination is then made as to whether or not a component is brought back (ST8). When no component is determined to be brought back, the mounting head 10 is transferred to the component feeding unit 4, where the mounting head 10 proceeds to component pickup operation for a next component-mounting round (ST10). On the contrary, when the component is determined to be brought back in (ST8), the mounting head 10 is transferred to a component discard box set within the head transfer range. After the brought-back component still retained by the pickup nozzle 11 is discarded (ST9), the mounting head 10 proceeds to component pickup operation for a next component-mounting round (ST10).

As mentioned above, in the component mounting apparatus described in connection with the embodiment, a transfer pathway of each of the mounting heads 10 in a component-mounting round during which the mounting head 10 moves back and forth between the corresponding component feeding unit 4 and the substrate conveyance mechanism 2 is derived for each component-mounting round from the mounting program data 21a. A focusing point of the line sensor camera 14 achieved during imaging operation is matched to a desired position on the basis of data pertaining to the thus-derived transfer pathway, whereby the focusing point of the line sensor camera 14 can be matched to the transfer pathway of each of the mounting heads 10 in each of component-mounting rounds. Accordingly, even when a long substrate 3 is taken as an object, it is possible to detect with high precision whether or not a component still exists on any of the pickup nozzles 11 of the mounting heads 10.

The present patent application is based on Japanese Patent Application (JP-2010-182044) filed on Aug. 17, 2010, the entire subject matter of which is incorporated herein by reference.

INDUSTRIAL APPLICABILITY

The component mounting apparatus and the component detection method of the present invention yields an advantage of the ability to detect with high accuracy whether or not a component is still on a pickup nozzle of a mounting head even when a long substrate is taken as an object. The apparatus and the method are useful in a component mounting field where a mounting head picks up a component from a component feeding unit and transfers and mounts the component on the substrate.

DESCRIPTIONS OF THE REFERENCE NUMERALS AND SYMBOLS

1 COMPONENT MOUNTING APPARATUS
2 SUBSTRATE CONVEYANCE MECHANISM
3 SUBSTRATE
3a COMPONENT MOUNTING POINT
4 COMPONENT FEEDING UNIT
5 TAPE FEEDER
7 Y-AXIS TRANSFER TABLE
8 X-AXIS TRANSFER TABLE
9 HEAD TRANSFER MECHANISM
10 MOUNTING HEAD
11 PICKUP NOZZLE
13 LIGHT PROJECTION UNIT
14 LINE SENSOR CAMERA UNIT
15 IMAGING UNIT
16 OPTICAL SYSTEM
17 OPTICAL SYSTEM ZOOMING MECHANISM
18 OPTICAL SYSTEM FOCUSING MECHANISM
19 LIGHT RECEIVING UNIT
19a LINE SENSOR
P COMPONENT

The invention claimed is:

1. A component mounting apparatus that picks up a component from a component feeding unit by a mounting head, transferring and mounting the component on a substrate, the apparatus comprising:

a substrate conveyance mechanism that conveys the substrate in a first direction, positioning and retaining the substrate at a component mounting operation position and a head transfer mechanism that transfers the mounting head in the first direction and a second direction orthogonal to the first direction by a first transfer mechanism and a second transfer mechanism, thereby moving the mounting head between the substrate conveyance mechanism and the component feeding unit disposed beside the substrate conveyance mechanism in the second direction thereof;

an imaging unit that includes a light projection unit projecting a belt-like inspection beam and a line sensor camera which receives the inspection beam and which outputs the beam as image data representing a state of a lower end of a pickup nozzle attached to the mounting head and that are configured such that the light projection unit and the line sensor camera are placed opposite to each other with a transfer pathway of the mounting head interposed therebetween and outside a transfer stroke of the mounting head in the first direction thereof;

a focusing processing unit that controls an optical system whose focusing point is variably set on the line sensor camera, thereby adjusting the focusing point of the line sensor camera to a desired position during imaging operation;

a transfer pathway calculation unit that derives, in each of component-mounting rounds, from mounting program data targeted for the substrate the transfer pathway of the mounting head in a component-mounting round during which the mounting head is moved back and forth between the component feeding unit and the substrate conveyance mechanism;

an imaging control unit that controls the focusing processing unit on the basis of data pertaining to the derived transfer pathway, thereby matching the focusing point of the line sensor camera to the transfer pathway of the mounting head in each of component-mounting round; and a determination processing unit that determines from the image data whether or not a component exists on the lower end of the pickup nozzle.

2. The component mounting apparatus according to claim 1, wherein the optical system is equipped with a zooming mechanism for adjusting an imaging range of the line sensor camera to a desired size in accordance with the focusing point of the optical system.

3. A component detection method for detecting whether or not a component exists on a lower end of a pickup nozzle of a mounting head in a component mounting apparatus that picks up a component from component feeding unit by the mounting head, transferring and mounting the component on a substrate, wherein the apparatus comprises a substrate conveyance mechanism that conveys the substrate in a first direction, positioning and retaining the substrate at a component mounting operation position and a head transfer mechanism that transfers the mounting heads in the first direction and a second direction orthogonal to the first direction by a first transfer mechanism and a second transfer mechanism, thereby moving the mounting head between the substrate conveyance mechanism and the component feeding unit disposed beside the substrate conveyance mechanism in the second direction thereof, an imaging unit that includes a light projection unit for projecting a belt-like inspection beam and a line sensor camera which receives the inspection beam and which outputs the beam as image data representing a state of the lower end of the pickup nozzle attached to the mounting head and that are configured such that the light projection unit and the line sensor camera are placed opposite to each other with a transfer pathway of the mounting head interposed therebetween and outside a transfer stroke of the mounting head in the first direction thereof, and a focusing processing unit that controls an optical system whose focusing point is variably set on the line sensor camera, thereby adjusting the focusing point of the line sensor camera to a desired position during imaging operation; and wherein the method includes a transfer pathway calculation step of deriving, in each of component-mounting rounds, from mounting program data targeted for the substrate the transfer pathways of the mounting head in a component-mounting round during which the mounting head are moved back and forth between the component feeding unit and the substrate conveyance mechanism, an imaging control step of controlling the focusing processing unit on the basis of data pertaining to the derived transfer pathways, thereby matching the focusing point of the line sensor camera to the transfer pathway of the mounting head in each of the component-mounting rounds, and a determination processing step of determining from the image data output from the line sensor camera whether or not a component exists on the lower end of the pickup nozzle.

4. The component detection method according to claim 3, wherein the optical system is equipped with a zooming mechanism for adjusting an imaging range of the line sensor camera to a desired size, and in the imaging control step the imaging range is adjusted in accordance with the focusing point of the optical system.

* * * * *